United States Patent [19]

Deforeit

[11] 4,402,243
[45] Sep. 6, 1983

[54] SYNTHESIZER CIRCUIT FOR ELECTRONIC MUSICAL INSTRUMENT

[76] Inventor: Christian J. Deforeit, 202, Rue des Joncs Marins, F-91620 La Ville du Bois, France

[21] Appl. No.: 235,843

[22] Filed: Feb. 19, 1981

[30] Foreign Application Priority Data

Feb. 22, 1980 [FR] France .................. 80 03892

[51] Int. Cl.³ .................. G10H 1/06; G10H 7/00
[52] U.S. Cl. .................. 84/1.01; 84/1.19; 84/1.28
[58] Field of Search .............. 84/1.01, 1.11–1.13, 84/1.19–1.28

[56] References Cited

U.S. PATENT DOCUMENTS

4,046,047 9/1977 Roberts .................. 84/1.01

Primary Examiner—Stanley J. Witkowski

[57] ABSTRACT

A digital synthesizer primarily intended for use in electronic musical instruments which are microprocessor controlled includes a plurality of storage devices which contain numerical data commensurate with the characteristics of an output signal to be produced. Information is read out of these storage devices under the control of command signals having a predetermined repetition frequency. The generation of the command signals is controlled in such a manner as to permit the generation of harmonically related frequencies.

9 Claims, 6 Drawing Figures

SYNTHESIZER CIRCUIT FOR ELECTRONIC MUSICAL INSTRUMENT

BACKGROUND OF THE INVENTION

The invention relates to a polyphonic numerical synthesizer of periodic signals for use in generating musical sounds and in particular to electronic musical instruments provided with such synthesizer circuitry.

The present invention is an improvement over known synthesizer circuitry in which each analog sample value fed to an output channel is derived from a plurality of numerical data commensurate with the instantaneous phase, the octave and the amplitude of the sound to be produced. Information corresponding to this indispensable data is stored in a plurality of random memories. The memories may be programmed by means of a control circuit, preferably using a microprocessor which is operable independantly of the synthesizer circuitry. Such prior art synthesizer circuits are described in my patents 4,344,343, 4,149,440, 4,217,802 and 4,279,186.

The disclosure of said patents is included herewith by reference.

In the known synthesizer circuits the number of basic frequencies is limited. The term "basic frequency" is intended to designate a frequency from which further frequencies may be derived, generally by successive division (octaves). All frequencies of the synthesizer circuit, and this is common practice, are derived from oscillators (at least 12 in chromatic tuning), the number of said oscillators, however, being limited. Alternatively, the plural oscillators may be replaced by one single oscillator plus divider circuits which receive the output of the oscillator. In either case, however, in order to generate certain complex sounds, it becomes necessary to employ frequencies not contained in the number of available frequencies from the oscillators or dividers. The addition of further oscillators or further divider circuits in order to permit the generation of these complex sounds would render a synthesizer circuit very complex, and consequently the manufacture thereof would be quite expensive.

SUMMARY OF THE INVENTION

It is the object of the present invention to provide a synthesizer circuit which has the capability of generating arbitrary frequencies without the necessity of increasing the number of oscillators or divider circuits.

It is a further object of the present invention to provide a synthesizer circuit which may be controlled by means of command signals supplied by external control circuits by simple writing into memories.

According to the invention the foregoing and other objects are achieved by use of a memory bloc comprisng a group of memories which contain all data necessary for the synthesis of the successive analog sample values of one single analog signal or several signals which are harmonically related (basic frequency and octaves or harmonic frequencies). In accordance with a first embodiment the generation of a sample value may comprise a single read-out operation, the group of numerical data being available under the same address in parallel and simultaneously. In another embodiment several read-out operations may become necessary, the data being available at different addresses, certain data being stored in intermediate registers. Both embodiments are equivalent.

The selection of the embodiment to be employed will depend upon the organization of the memories. In order to generate a basic signal with correlated harmonics, for example, the data value of the phase may be common to all of the frequencies and may be read out at a time which does not coincide with the reading of the other data so to permit an improved efficiency of the memories.

An important advantage of the invention results from the fact that the clock generator-counter-combination, whose count serves as the reference value for all comparisons with the event memory, need be provided only once and will be automatically incremented at each pulse of a clock generator so that it will be independent of other portions of the synthesizer circuit. Thus, the clock generator-counter combination will provide a time basis common to all synthesizing operations.

A further advantage of the invention resides in the versatility by which the frequency of the generated signals may be modified under the supervision of external control circuits, and this refers in particular to the modification of the contents of a period memory. Further, it is possible to obtain a relative variation of the signal phases with respect to each other by variation of the contents of the event memory. In the latter case, however, the complete control of the event memory contents by means of external control circuits becomes somewhat difficult and complex. Therefore, an important feature of the invention is the provision of an additional memory wherein is stored a numerical data value commensurate with the modulation. Further, circuits for producing an automatic variation relative to the time are provided for the data values of a period TE whereby an automatic phase modulation, based on the sythesis data to which such modulation data are correlated, will result.

DESCRIPTION OF THE DISCLOSED EMBODIMENTS

Figure 1:
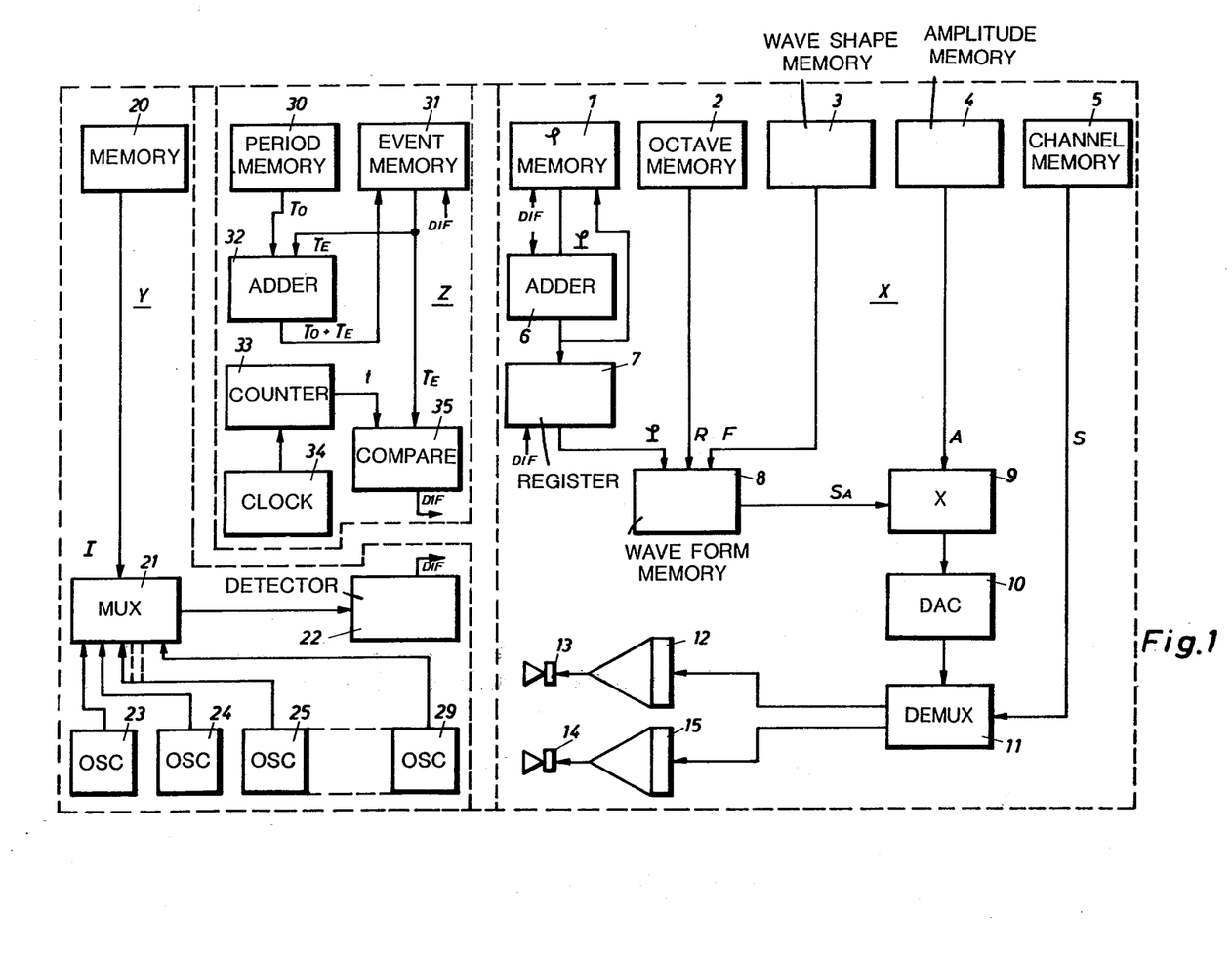
FIG. 1 is a composite block diagram which depicts both a synthesizer in accordance with the present invention and a prior art synthesizer, both the present invention and the prior art sharing circuitry shown in the Figure and both the present and prior art synthesizers being employed together in some applications.

FIG. 1 illustrates the principle of a synthesizer according to the invention.

FIG. 1 depicts three subsystems which, for sake of clarity, are shown separate from each other. Subsystem X comprises the means for the generation, from sample values of sound signals to be generated and may be circuitry in accordance with my U.S. Pat. No. 4,279,186. Subsystem Y comprises first control means for generation of said sample values from the outputs provided by a plurality of oscillators or dividers, and is representative of the prior art. Subsystem Z comprises control circuitry in accordance with the present invention.

For a detailed description of the operation of subsystem X reference may be had to aforementioned U.S. Pat. No. 4,279,186.

An operative synthesizer includes three subassemblies. A first of these subassemblies comprises the memory blocks, i.e., the so-called "virtual key-board", which provides the parameters necessary to synthesize the desired signals. A second of these subassemblies consists of a circuit to generate the sample values based on data read from each of said memory blocks. The third of these subassemblies comprises the circuits for addressing the memory blocks and for controlling the synthesis in accordance with a predetermined interlinking.

It will be understood that each sound generated by the synthesizer is one or a combination of several elementary signals which may or may not have a sinusoidal waveform. Further, of the complex signal is commensurate with and appropriately filtered analog sample value filtered, and that all analog samples are generated sequentially, i.e. one after the other. Further, it is to be kept in mind that the frequency of the sampling of each elementary signal must be sufficiently high so as not to interfere with the quality of the generated sound.

The synthesis of a sound, thus, is made by the circuits of portion X. The paramters defining the sound are stored in the memory blocks of the virtual keyboard. This virtual keyboard X comprises:

memory 1 for the instantaneous phase $\phi$ (the same memory 1 may be used for the synthesis of several samples of the signals harmonically relates to each other, for example basic sound and octaves), memory 2 for number R of the octave, memory 3 for the number F of a wave shape, memory 4 for the amplitude A of the signal, memory 5 for the number S of an analog output channel.

In operation the phase $\phi$ is incremented in an adder circuit 6, and the new phase $\phi$ is written into memory 1 in place of the previous phase number and is also intermediately stored in a register 7.

The phase $\phi$ data from register 7, the octave R data and the number F of the wave shape are combined to define the address input to wave shape memory 8. Upon addressing, memory 8 provides a numerical sampling value SA which is multiplied by amplitude A data in a multiplier 9. The resulting numerical sample is thereafter converted into analog form by means of a converter 10 and then supplied to a demultiplexer 11. The latter, controlled by the number S provided at the output of memory 5, directs the final analog sample either to a first output channel, comprising integrator amplifier filter 12 and loud speaker 13 or to a second output channel, comprising the similar assembly of integrator/amplifier/filter 15 and loud speaker 14.

The entire synthesizing process of each sample is controlled by a control signal "DIF" whose repetition frequency is equal to $F_s \times N \times 2^R$, $F_s$ being the frequency of the basic signal, $F_s \times 2^R$ being the frequency of the signal to be generated at octave R and N being is the number of the sample values to be generated per signal period, the product $N \times 2^R$ being constant.

To generate the signal "DIF" and to synchroniously address the memory blocks containing the information of the respective sample values to be computed, it is particularly advantageous to combine the successive addressing of the memory blocks in accordance with a certain interlinking (i.e. each memory block comprises the address of the next memory block to be addressed) and the selection of the oscillators (there being as many oscillators as basic frequencies).

The subsystem Y in FIG. 1 is illustrative of a prior art circuit for generation of signal "DIF".

The memory block containing the parameters of a sample value comprises a memory 20 containing the identifying number I of an oscillator. The number I is supplied to a multiplexer 21 having a plurality of inputs coupled to the outputs of oscillators 23, 24, 25 . . . 29. Each oscillator generates a square signal which is fed to an edge detector circuit 22 generates for each level variation, the signal "DIF".

There are two possibilities when a memory block is addressed.

In a fire case the edge detector supplies a signal "DIF" and a sample value is computed (including incrementing of phase $\phi$), and thereafter the addressing of another memory block is effected. In the other case no level exchange has been detected, as will be described in detail below and the addressing of the next following memory block is effected without generation of a scanning sample.

The manner in which the command "DIF" is generated in accordance with the present invention, as contrasted with the manner in which this command is generated by the prior art subsystem Y, may be seen by reference to subsystem Z in FIG. 1.

In accordance with the invention the plurality of oscillators 24-29 in subsystem Y is replaced, by a single clock pulse generator 34 whose frequency is about 1 . . . 2 MHz. The clock generator is coupled to a numerical counter 33 whose count t, thus, is regularly incremented and forms a time base.

Rather than employ an oscillator selection memory 20, the present invention utilizes comprises two memories 30 and 31. The first memory 30 holds a number T0 representative of the half period of the basic signal of frequency $F_s$ as discussed above. The other memory 31 holds a number TE representative of an instant, starting from which a scanning sample of the signal will be generated.

Upon each addressing of a memory block, a comparator 35 will compare the count t of time counter 33 with the contents TE of the event memory 31.

Analog of the embodiment of subsystem Y of FIG. 1, there are two possibilities.

Thus, either t is "prior" to TE, and the addressing of the following memory block is effected without generation of a scanning sample, or alternatively, t is "later" or equal to TE and a signal "DIF" is generated and will effect:

on the one hand, synthesis of the respective scanning sample as explained above (including incrementing of phase $\phi$), on the other hand the addition of T0 and TE in an adder circuit 32 and the writing of the result T0+TE into memory 31 at the memory location of the previous value TE.

The accuracy of the repetition frequency at which the signal "DIF" is generated will depend upon the number of bits representing the numbers TE and T0, respectively, i.e. the capacity of memories 30, 31. Designating $f_T$ as the frequency of clock pulse generator 34 results in the following $$f_{DIF} = 2^k/T_0 \times f_T$$

where k designates how many significances (in binary system) t will be shifted to the left with respect to T0. Therefore, it is possible to have the synthesizer operate with relatively low frequency values for $f_T$, said frequency being just sufficiently high to avoid jitter in the generation of signal "DIF". There is, however, no need to provide an integer relation between $f_T$ and the audio frequencies to be generated.

The subsystem Z of the present invention, when contrasted to the prior art as represented by subsystem Y of FIG. 1, provides the following advantages:

The memories 30 and 31 are included in the "virtual keyboard", similar to the remaining information storage means and, thus, they are accessible to control devices external to the synthesizer. The data held therein consequently are variable. Therefore, it is possible to vary the frequency of the signal by variation of T0. Further, it is possible to affect TE so to provide a phase modulation (relative to the phase of the other signals). Moreover, the number of frequencies it is possible to generate is unlimited.

The terms "prior" and "later", respectively, which were employed above to characterize the result of the comparison made by comparator 35 mean, in numerical terminology, "smaller" and "greater", respectively.

This, however, is true only if the compared numbers are unlimited. In practice, however, the values TE and t must be limited because of the sizes and expenses for the memories, and a practical value is 10 bits (in decimal system numbers between 0 and 1023). This is to be understood as an example and means, in a practical embodiment the compared numbers t and TE have values t+1024 p and TE+1024 p', respectively, where p and p' are integers and are equal or differ by one unit.

The comparator 35 may, for example, comprise merely a subtracting circuit. The signal "DIF" is obtained if the sign of (t−TE) is positive.

As an alternative mode of generating the "DIF" signal, the counter 33 may be replaced by a decrementing counter. The information t, thus, is to be understood as −t. The comparator 35 will then be a simple adding circuit fed with −t and TE. The most significant bit, i.e. the sign at the output of the adding circuit (comparator 35) equals 1 if TE−t is negative (i.e. if t is "later" than TE) and the "DIF" signal is generated.

It will be understood that the invention is not limited to synthesizers using memory blocks organized in a parallel structure. Thus, the present invention is similarly applicable to structures as described in my above referenced patents. Further, it is possible to combine the two methods for the generation of signal "DIF", i.e., the subsystems Y and Z may be employed together. In the latter case certain of the memory blocks may comprise a selector memory 20 for an oscillator, and other blocks may comprise a memory 30 and event an memory 31. In such an embodiment a selection parameter contained in a supplemental memory element of each memory blocks (one bit being sufficient) will permit the selection of either circuit Y or circuit Z for the generation of signal "DIF".

The synthesizer, thus, will comprise selection means for the command signal "DIF" either generated by subassembly Y or by subassembly Z, dependant upon said selection parameter. Such a selection means is not illustrated as it is readily conceivable by those skilled in the art.

Accordingly, external control devices will provide the period (or half period) of the highest octave of the sound to be generated the period information will be furnished independantly for each memory block. This process will permit the generation of sounds of arbitrary frequencies. It will be understood that the maximum number of signals the synthesizer is apt to generate will depend upon the memory size of the virtual keyboard and upon the scanning frequency of the memory blocks.

Figure 2:
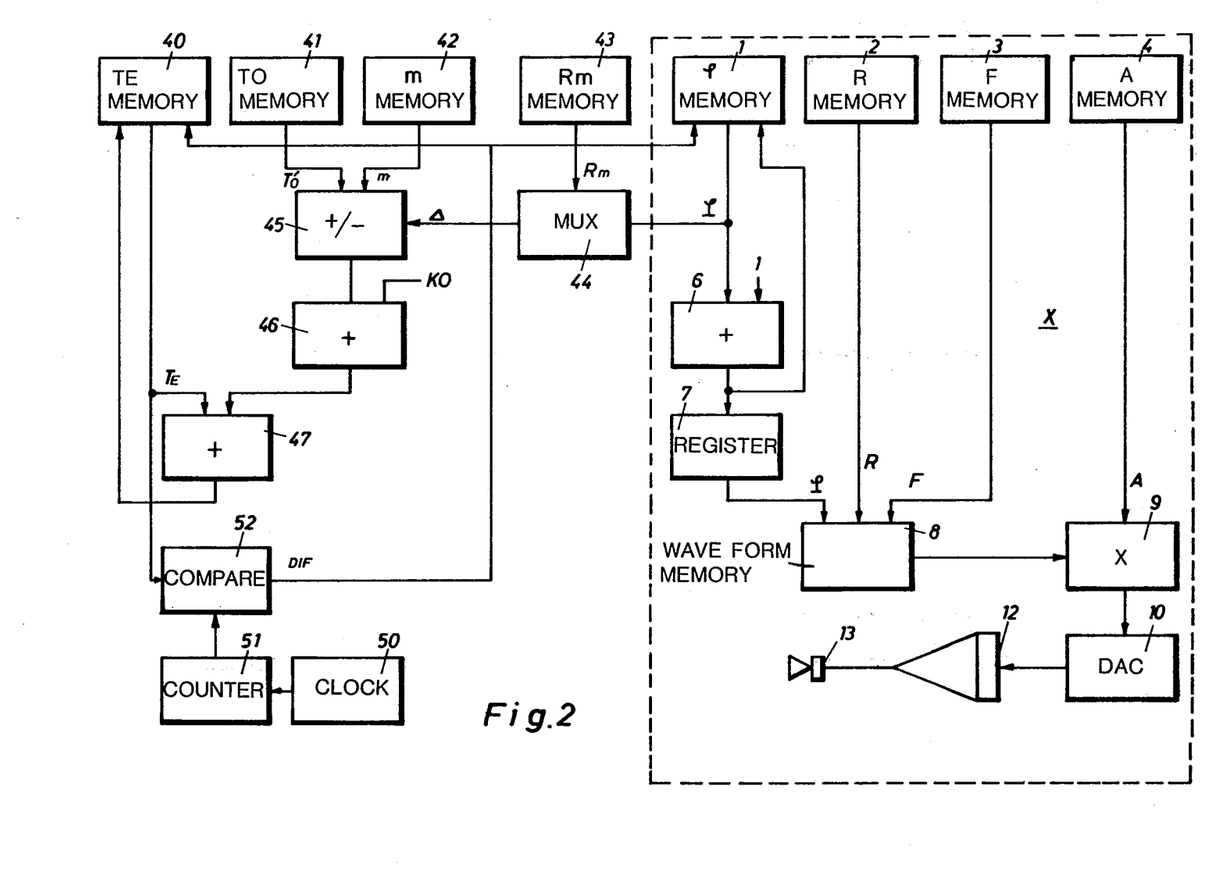
FIG. 2 is a block diagram of a synthesizer in accordance with the invention and characterized by for automatic phase modulation.

FIG. 2 shows a synthesizer in accordance with the invention wherein a selective phase modulation of certain signals is possible.

As in FIG. 1 the synthesizer comprises the means X for the scanning sample generation and the control mean for generation of signal "DIF". To simplify the explanation, subsystem X has been provided with the same reference numerals as in FIG. 1, and as to its function the description of FIG. 1 may be referred to.

In the FIG. 2 embodiment the virtual keyboard comprises means for storing, in addition to the phase information $\phi$ (memory 1), the octave information R (memory 2), the type F of the wave shape (memory 3) and the amplitude A (memory 4):

the event time TE (memory 40),
the period T'0 (memory 41),
the modulation coefficient m (memory 42),
the octave selection of the modulation Rm (memory 43).

The object of the present invention is not to provide frequency modulation and thus the value T'0 remains constant unless a variation is provided by external control means. On the contrary an automatic phase modulation is intended to be effected by the synthesizer. Such modulation is made upon each command "DIF" by updating TE.

It has been explained above that the generation of a command "DIF" will commence the computation and memorizing of a new value of TE:

New value of TE=TE+T0 where To=the period of the sampling rate

T0 may be expressed in another manner: T0=T'0+K0±m wherein T'0+K0 is equal to the value T0, used in FIG. 1 and defining the frequency of the signal.

Since at least two samples are necessary to define one period of the signal of interest, T0 also represents the half period of the highest frequency the instrument is capable of producing.

K0 is a constant systematically supplemented to all values of T'0 by the synthesizer such that the size of the memory necessary to memorize this value T'0 is replaced.

T'0 will now be representative of the frequency of the signal.

m is the coefficient of the modulation amplitude which either is added or subtacted. This coefficient, memorized in the virtual keyboard, may be programmed by external controls. The addition or subtraction of m is provided automatically by the synthesizer upon each command "DIF". Moreover, the cycle of adding and subtracting, i.e. the modulation frequency, may also be controlled by external means.

Consequently, the synthesizer comprises phase modulation means for each signal, controlled with respect to the amplitude data from memory 42 (m) and with respect to the frequency from memory 43 (Rm).

FIG. 2 illustrates in detail an embodiment to implement such phase modulation.

The sign + or −, related to m, is determined by the value of one bit of phase $\phi$. With respect to the time this bit is a square signal. The selection of the bit is implemented by the value Rm in memory 43. The value of m, of course, must be smaller than K0. The memory block containing m and Rm will be designated as the modulation block. The information Rm controls the selection of a bit of the phase (the more significant bit if Rm=0, the less significant bit if Rm=7).

Rm is supplied to a multiplexer 44 which also receives the $\phi$ data from memory 1. The selected by multiplexer 44 controls an adding/subtracting circuit 45 which receives the information T'0 from memory 41 and the information m from memory 42. The result T'0±m is supplied to adding circuit 46 which will add the constant value K0.

The output of adder 46 is supplied to a further adding circuit 47. Adder 47 receives the TE data from memory 40. The output of adder 47, accordingly, is representative of the total TE+T'0+K0±m. If the signal "DIF" is present this value will be written into memory 40.

The signal "DIF" will be generated as explained above. A clock generator 50 decrements regularly a down counter 51. A comparator 52 (in reality a simple adding circuit) supplies the signal "DIF" (most significant bit of the difference TE−t) on the one hand to TE memory 40 and on the other hand to phase memory 1 for phase $\phi$.

Since a bit of phase $\phi$ defines a square signal, the repetition period of additions +m will be equal to the period of repetitions of subtractions −m. The mean period of the generated signal, thus, will be T'0+K0. Accordingly there is no frequency modulation; frequency modulation, however, may in any case be provided by the external means if made operative to effect T'0.

It will be understood that other options exist for the modulation of phase and/or amplitude of signals and that such modulations may be implemented automatically by the synthesizer based on information with respect to such modulation and written into the block of memories together with the other information relating to the signals to be modulated.

Figure 3:
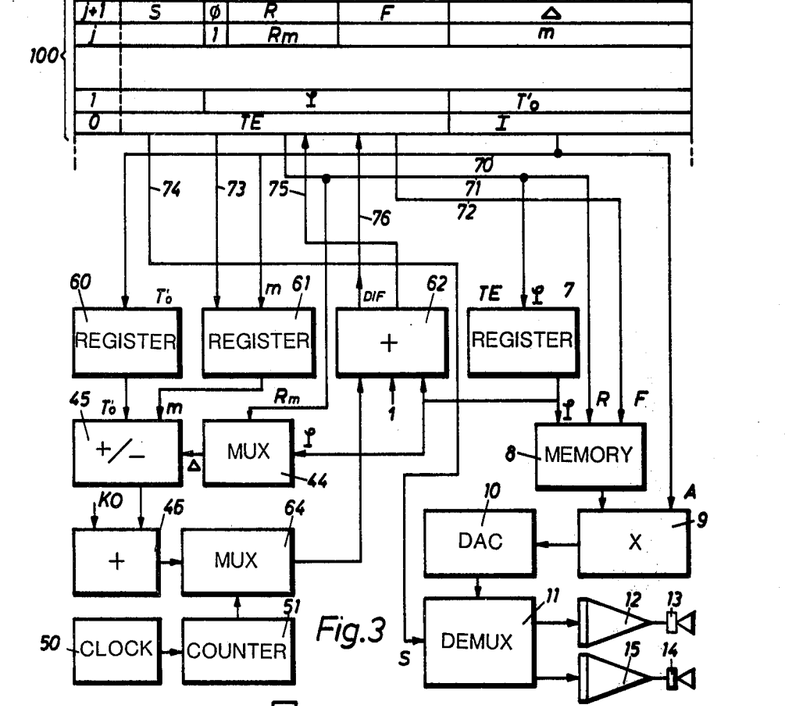
FIG. 3 is a functional block diagram of a synthesizer circuit in accordance with the present invention.

FIG. 3 illustrates an embodiment of the synthesizer wherein a different organization of the virtual keyboard memories will allow the performance of certain functions as described above with a reduced number of circuits, certain circuits being combined.

The same reference numerals will be used as in the previous figures if relating to same components.

Instead of the organization of data relating to each signal in one single memory block permitting the reading of all such data in parallel, the data are distributed over serial block relating to one and the same group, however, under different addresses, preferably under successive addresses.

Such an organisation of memories has been described in detail in patent 4,279,186.

The address of each block is a number consisting of two portions. The first portion I designates the entirety of the group and the second number N designates one bloc of the group. The addressing of the different blocks of one and the same group is made by modification of the value of N only. Each block provides a secondary pointer which defines the value of N of another block and permits to interlinking of the readout operations of the blocks in one and the same group.

A group may comprise blocks which will provide information on which the generation of several signals may be based if such signals are harmonically interrelated (for example a basic frequency and several octaves). Information which is common to all signals of interest will then exist combined in one or two so-called main blocks; the other information necessary for the synthesis of these signals being contained in the secondary blocks. At the instant of the addressing of the or each main blocks, and under the assumption that the condition t−TE≧0 is not fulfilled, the entire remainder of the group may remain ignored, and a main pointer permits addressing of another group.

The virtual keyboard 100 is, for example, is divided into 16 groups of 16 blocks each. Only one of these groups is shown in FIG. 3. The group depicted in FIG. 3 comprises two main memory blocks while all the others are secondary blocks. For sake of clarity the blocks are enumerated by 0, 1, j, j+1, ... and so on.

The block 0 is the first block addressed in the group. The block designated 0 contains the value TE (event data) and the number I of the following group.

The block designated 1 is addressed after the addressing of block 0 only if t≧TE comprises the instantaneous phase $\phi$ and the period T'0.

The remaining blocks (i.e. the secondary blocks) contain the other synthesis information.

The block designated j will be considered as an example, this block being designated as the modulation block and containing the modulation octave Rm and the modulation coefficient m. The following block j+1 contains the number S of an output channel, the octave R, the wave shape F and the amplitude A of the signal to be generated.

Each secondary block further comprises an element permitting identification of the modulation block, and in the present example this is a bit 1 in the modulation block and 0 in the other blocks.

It will be understood that if a group does not comprise a modulation block the signals respectively generated will not be modulated and the respective modulation circuits will not be rendered active.

As described above the organization of the data in the memories is implemented in such a manner that the synthesizer circuits may be used in common.

These circuits comprise:

an intermediate register 7 to which either the phase information $\phi$ or the data TE read from the main blocks 1 and 0, respectively, are transmitted via connection 71, a waveform memory 8 with correlated addressing circuitry to which the data of phase $\phi$ from intermediate register 7, of octave R from block j+1 via connection 71 and of the wave form F from block j+1 are fed via connection 72, a multiplier circuit 9 to which a scanning sample from memory 8 and the amplitude A from block j+1 are supplied connection 70, a digital-to-analog converter 10 to which the output data of the multiplier 9 are fed, a demultiplexer 11 to which the analog scanning samples from converter 10 are applied and which is controlled by the channel selection data S received from block j+1 via connection 74, two amplifier channels for low frequency each containing an integrator amplifier 12, 15 and a loud speaker 13, 14 coupled to the outputs of the demultiplexer, an intermediate register 60 for intermediately storing the data of period T'0, received from block 1 via connection 70, an intermediate register 61 which receives the modulation coefficient m read from modulation block j, a multiplexer 44 which receives as an input the data of phase $\phi$ read from the output of the intermediate register 7 and controlled by the data Rm, read from block j (connection 71)

an adding/subtracting circuit 45 fed with T'0 and m from intermediate registers 60 and 61, respectively, and controlled by the sign s, delivered by multiplexer 44, an adding circuit 46 to receive K0 and the output data of adding/subtracting circuit 45. The output of adder 46 is thus the value T'0+K0+m.

a clock generator 50 for controlling a down counter 51 which defines the time scale, a multiplexer 64 which receives the quantity T'0+K0±m from adding circuit 46 and the timing signal −t from down counter 51, an adding circuit 62 which receives the output signals from register 7 ($\phi$ or TE), the value 1, and the output signal of multiplexer 64 (T'0+K0+m or −t). This adding circuit delivers, via connection 75, a total to be memorized and the signal "DIF", via connection 76, to the virtual keyboard.

The synthesizer operates as follows:

The virtual keyboard 100 is subdivided into groups which in turn are subdivided into blocks. The addressing of each block is accomplished with the aid of a numerical address delivered by an addressing circuit (not shown). The first block read out in group I has as its address: (I, N=0). This block contains TE and the number I of a following group. The Te Data is fed to adding circuit 62 (via intermediate register 7) simultaneously with −t data (via multiplexer 64). The signal "DIF", thus, is number I is group transmitted by means of the addressing circuit, and the preceding operations will be repeated for another group.

If the condition TE−t<0 is met, block N=1 of group I is addressed. The data $\phi$ and T'0 are memorized in the intermediate registers 7 and 60, respectively. $\phi$ is incremented in adding circuit 62, and $\phi+1$ will be loaded into the memory space of $\phi$ in the virtual keyboard.

Thereafter, the following blocks of the group will be successively addressed. These blocks each contain at their ends a secondary pointer which is read and transmitted by means of the addressing circuit (not shown, but described in patent 4,279,186). The blocks so addressed may be non-modulating blocks as the block j+1. In this case a scanning sample is computed by means of the present data $\phi$ (present in intermediate register 7), S,R,F, and A.

If the group contains a modulating block, as is the case for the illustrated block j, the information 1 stored therein will be transmitted via connection 73 to the m register 61 and the following operations will be performed:

The modulation octave Rm and the modulating coefficient m are combined with T'0, which has been stored in register 60, so to form the T'0+K0±m information which appears at the output of multiplexer 64. Multiplexer 64 comprises a memory, and upon the termination of computation and generation of the scanning samples (non-modulating blocks) again the block (I, N=0) will be addressed and the value TE will be replaced by TE+T'0+K0±m. The following value I permits thereafter the addressing of another group, and the preceding operations may be repeated automatically.

Figure 4:
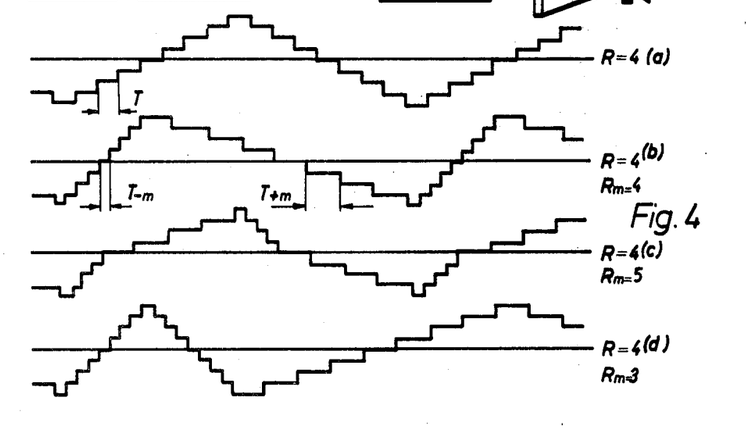
FIG. 4 is a waveform diagram which represent operation of the present invention.

FIG. 4 illustrates as an example several signals which may be generated by means of the invention.

The signal (a) is a triangular signal which is non-modulated and characterized by the octave R=4. This is a spare case signal, each step having the length T with T=T'0+K0.

The signal (b) is the same signal, however, subject to a phase modulation with the coefficient m=½T and with the modulation octave Rm=4. It may be seen that the even harmonics are emphasized in signal (b).

The signal (c) is again the same signal modulated by the same coefficient, however, with Rm=5. In signal (c) the odd harmonics are emphasized.

The signal (d) again is the same signal modulated by the same coefficient, however, the modulation octave Rm in this case is smaller than R (Rm=3). The occurrence of the basic frequency at R=3 may be recognized.

The possibility of the automatic modulation of the generated signals by the synthesizer, offers very intersting properties depending upon the modulation octave Rm and the modulated octave R: If Rm=R the even numbered harmonics appear or are emphasized. If Rm>R only the odd harmonics appear or will be emphasized, and if Rm<R a basic frequency (or subharmonic) to frequency R will occur.

It will be understood that the dimensioning of the introduced harmonics will depend upon the modulation coefficient m and may be controlled externally. Thus, it will be possible to provide a variation of the sound colouration in a quasicontinuous manner in dependancy upon the time which is important for a convincing simulation of instruments to be simulated (for example brass wind instruments, wood wind instruments). Similarly it is possible to provide an antomatic variation of value m (or of the value Rm); the same is true for the other values (without resort to the external control means), in that the synthesizer may be provided with automatic interpolation circuitry. This interpolation, linearly or exponentially may be made time-dependant between the current value of the respective information and a terminal value also memorized in the virtual keyboard.

The invention may be used in musical instruments of the type of the electronic organ or may be used in theatre instruments or for musical research. Each instrument may comprise one or several such synthesizers and their control means, for example a microprocessor with correlated periphery circuitry effecting the scanning of tabs, keyboards and switches and providing the input of data for the synthesis into the virtual keyboard in dependancy upon a certain programme.

The microprocessor and its periphery circuitry form the external control means of the synthesizer. The microprocessor will write into the virtual keyboard the data needed for the automatic operation of the synthesizer. In addition to the usual data for the synthesis ($\phi$, R, F, A, S, T'0, TE, m Rm and so on) these external control means must write into each block the addresses and pointer data permitting a proper automatic reading of the memories by the synthesizer in accordance with a desired interlinking. Of course, the address registers of the blocks of the virtual keyboard have not been illustrated so to keep the drawings free of superfluous matter because such address registers are devices with which those skilled in the art are familiar; in this connection the patents mentioned above may be referred to.

Upon each variation of the status of registers, keyboards, or tabs the external control means will vary the data written into the virtual keyboard so to generate different sounds.

These modifications may involve one or several parameters of an elementary signal (in one block), they may further involve the supression or addition of blocks within one or several groups, or even the addition or supression of one or several groups. In case of the modification involving entire blocks or groups a simple modification of the memory pointer data will suffice to obtain the desired result.

It is apparent that the invention is not limited to the described embodiment. Generally, it will be possible to obtain an automatic variation of arbitrary numerical parameters of the synthesis of sound signals, thanks to the circuitry in accordance with the present invention. These circuits may be combined with those described in my U.S. Patent 4,344,343.

The automatic variation of the parameters by the synthesizer will not prevent variations commanded by external control means. Accordingly extremely great number of possibilities to effect the generated sound signals will be available.

The embodiments described above may, under certain circumstances, interfere with the musical quality. In fact, upon each scanning cycle the following operations are implemented:

An event time $T_E$ is compared by means of subtraction $T_E - t$ with the value of t, and if $t < TE$ it is indicated that the event time has not been reached and the next scanning step is to be implemented. If, however, $t \geq TE$ a new event time will be computed, the phase in incremented, and the scanning samples are computed. Only thereafter the next scanning step will be made.

It will, however, be recognized that depending upon the length of the I-list (i.e. the number of programme loops to be implemented) and depending upon the number of scanning samples to be computed, the latter will by no means all be generated at the same relative instant withinan a cycle. On the contrary, they will be available at an instant $T_0 > T_E$, the difference $T_0 - T_E$ being almost statistically variable. As result, the output signal contains a portion of broad band noise ("white" noise). This noise portion, however, may be suppressed by means of the circuit embodiment to be described hereunder.

The scanning samples calculated upon $t > T_E$ each consist of an amplitude information AMP and a wave form difference information $\Delta A$. In the circuit described so far the output signal is formed as the product AMP. $\Delta A$.

In accordance with the embodiment to be described with reference to FIGS. 5 and 6, so-called "partial sums" $S_{TE}$ are computed for a time $T_E$, thus, the sum $Amp_{TE} \cdot \Delta A_{TE}$. This computation, of course, takes place at an instant at which the parameters are available, i.e. at $t \geq T_E$. The result, however, is written into an intermediate memory under an address "next $T_E$" and not transmitted immediately to the output channels, but read out with constant clocking at the real time t, fed to a digital-to-analog converter and integrated to form the final signal $\epsilon S_{TE}$. Thus, there will be a time delay by one cycle but this is of no importance for musical applications.

Figure 5:
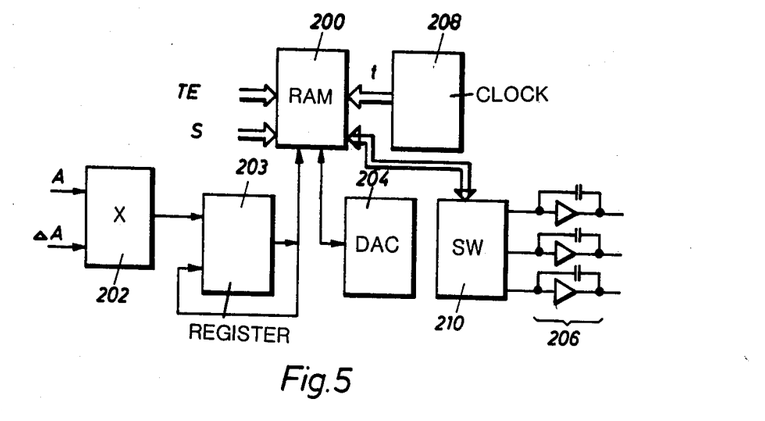
FIG. 5 illustrates the modification of the previous embodiments so to eliminate certain jitter signals.

FIG. 5 illustrates this end portion of the circuit. The random memory 200 may be addressed by means of two data: On the one hand by $T_E$ for writing if $t \geq T_E$, the addressing coming from the synthesizer, and on the other hand for reading by t, delivered by a clock generator 208. After the reading the respective memory element will be erased.

The data to be memorized are the products AMP. $\Delta A$. The factors are produced by the synthesizer, multiplied in multiplier 202 and accumulated in 203 so to generate the partial sum with respect to the time $T_E$. This partial sum $S_{TE}$ is stored. Upon the next occurrance of $t \geq T_E$, i.e. at the "precise" instant of the next $T_E$, the partial sum $T_E$ will be read out and transmitted to the digital-to-analog converter 204, and the analog value of the partial sum will be delivered to the integrator 206. This signal will be free of jitter.

The described circuit is particularly suited for several output channels because a writing address S from the synthesizer may have the form of the complement to the $T_E$-writing address. A cycling channel reading address in turn will then suitably have the form of the complement of the t address and will permit the applying of several digital-to-analog converters or of an analog multiplexer or of a channel distributor 210.

Figure 6:
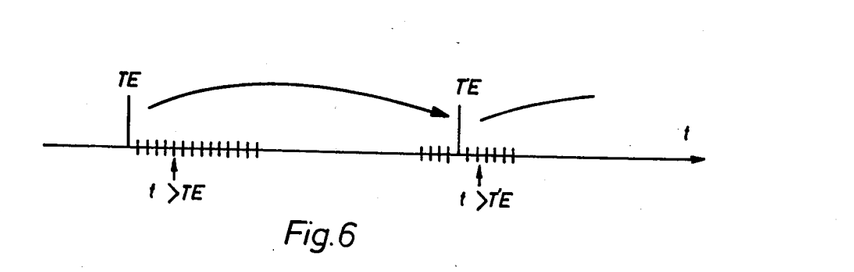
FIG. 6 is a graph which serves to explain the operation of the circuit shown in FIG. 5.

FIG. 6 illustrates the sequence of events: The time instants at which $t \geq T_E$ is detected is readily apparent, instants which are variable with respect to the instants $T_E$. The partial summing at the shifting to the next instant $T'_E$ is also readily apparent.

It will be understood that the invention may be applied in electronic musical instruments having one or several synthesizers as described above. For example, in organs, electronic accordions or novel instruments wherein advantageously digital electronic techniques will be used.

I claim:

1. In a polyphonic synthesizer for generating periodic signals, the synthesizer having a plurality of memories in which are stored numerical data commensurate with the instantaneous phase, octave and amplitude of an analog periodic signal to be produced, the synthesizer further having means for addressing and reading said memories and means responsive to command signals for generating scanning samples of the analog periodic signals to be produced from data read from said memories, an improved command signal generator comprising:

clock pulse generator means, said clock pulse generator means providing clock pulses at a fixed frequency;

counter means responsive to the pulses provided by said clock pulse generator means, said counter means storing a number commensurate with received clock pulses;

memory means having a plurality of memory locations for storing at respective of said memory locations a numerical period value and a numerical event value commensurate with the frequency of the analog signal to be produced;

comparator means receiving as input signals the stored numerical event value and the number stored in said counter means, said comparator means comparing the stored numerical event value with the number stored in said counter means and generating a command signal if said stored number is at least equal to said event value; and means for adding said period value and said event value and for storing the resulting total at the memory means memory location previously occupied by an event value in response to the generation of a command signal by said comparator means.

2. The synthesizer of claim 1 further comprising: means for automatically varing the stored period value as a function of time.

3. The synthesizer of claim 1 wherein said comparator means comprises: subtractor means, said subtractor means providing an output signal commensurate with the sign of the difference between the stored numerical event value and the number stored in said counter means.

4. The synthesizer of claim 1 wherein said counter means comprises: a down computer; and wherein said comparator means comprises: adder means, said adder means providing an output signal representative of the sign of the sum of the input signals received thereby.

5. The synthesizer of claim 2 further comprising: means for storing numerical data commensurate with an externally selected modulation amplitude coefficient and a modulation frequency; means responsive to said modulation coefficient and period values and to a control signal for selectively adding or subtracting said values; and means responsive to said modulation frequency and stored phase data for generating an add/subtract control signal for said means for selectively adding or subtracting, said control signal having a repetition frequency which depends upon said modulation frequency.

6. The synthesizer of claim 5 wherein said means for generating said control signals comprises: multiplexer means.

7. A polyphonic synthesizer for generating analog periodic signals comprising:
a plurality of memories, said memories having stored therein data commensurate with the phase, amplitude, octave, waveform, modulation, modulation octave, period, and an event time commensurate with the analog signal to be produced;
first storage register means, said first register means receiving timing information from said memories and providing a phase related output signal;
a waveform scanning sample memory, said scanning sample memory having address inputs connected to said waveform and octave memories, said scanning sample memory also receiving the output of said first register means as a read control input;
multiplier means responsive to scanning samples read from said scanning sample memory and amplitude data read from said memories for producing an output signal;
means responsive to the output signal produced by said multiplier means for producing an analog output signal;
clock means for generating timing control signals;
means responsive to the output signal of said first register means and data commensurate with event time read from said memories and to a first control signal for generating a command signal;
means for selectively adding or subtracting said period and modulation data read from said memories in response to a second control signal;
means responsive to said modulation octave data read from said memories and to the output of said first register means for generating said second control signal;
adder means for adding a constant to the output of said means for selectively adding or substracting; and
multiplexer means responsive to said timing control signals for delivering the output of said adder means as the first control signal to an input of said command signal generating means, the generation of a command signal causing the output of said adder means to be stored in the appropriate of said memories in place of the previously stored event time.

8. The synthesizer of claim 7 further comprising:
an intermediate memory, said intermediate memory receiving a command signal when generated and said event time data;
second clock means, said second clock means providing readout signals to said intermediate memory; and
means delivering the output of said multiplier means as an address input to said intermediate memory whereby data is read from said intermediate memory in a time-shifted manner.

9. The synthesizer of claim 8 further comprising:
a plurality of output channels, each of said output channels including an analog convertor; and
means for selectively coupling said intermediate memory to said output channels.

* * * * *

UNITED STATES PATENT AND TRADEMARK OFFICE
CERTIFICATE OF CORRECTION

PATENT NO. : 4,402,243

DATED : September 6, 1983

INVENTOR(S) : Christian J. Deforeit

It is certified that error appears in the above-identified patent and that said Letters Patent are hereby corrected as shown below:

Column 2, line 46, delete "for"
Column 2, line 64, after "values" insert a comma (,)
Column 3, line 21, after "further" insert -each element-
Column 3, line 22, "and" to -an-
Column 3, line 23, after "value" delete "filtered"
Column 3, line 34, change "relates" to -related-
Column 3, line 63, after "being" delete "is"
Column 3, line 66, change "synchroniously" to -synchronously-
Column 4, line 15, after "22" insert -which-
Column 4, line 19, change "fire" to -first-
Column 4, line 39, after "utilizes" delete "comprises"
Column 4, line 68, after "following" insert a colon (:)
Column 5, line 36, after "embodiment" insert a comma (,)
Column 5, line 59, after "a" insert -period-
Column 5, line 59, change "event an" to -an event-
Column 5, line 62, change "blocks" to -block-
Column 6, line 41, change "To"to -TO-
Column 6, line 42, after "rate" insert a period (.)
Column 7, line 13, after "The" insert -bit-
Column 7, line 20, after "47" insert -also-
Column 7, line 53, after "to" insert -the-
Column 7, line 57, change "serial block" to -several blocks-
Column 8, line 1, delete "To"
Column 8, line 12, change "blocks" to -block-
Column 8, line 16, before "divided" delete "is"
Column 8, line 59, after "supplied" insert -via-
Column 9, line 15, change "+m" to $-\pm m-$
Column 9, line 34, change "Te" to "TE"
Column 9, line 37, after "is", first occurrence, insert -- generated if TE-t $<$ 0. In the inverse case, only the --.

UNITED STATES PATENT AND TRADEMARK OFFICE
CERTIFICATE OF CORRECTION

PATENT NO. : 4,402,243
DATED : September 6, 1983
INVENTOR(S) : Christian J. Deforeit It is certified that error appears in the above-identified patent and that said Letters Patent are hereby corrected as shown below:

Column 9, line 37, change "is group" to -of the following group is-

Column 11, line 44, change "withian" to -within-

Column 13, line 15, (claim 4, line 3) change "computer" to -counter-

Signed and Sealed this

Third Day of July 1984

[SEAL]

Attest:

Attesting Officer

GERALD J. MOSSINGHOFF
Commissioner of Patents and Trademarks